United States Patent [19]

Dekker et al.

[11] Patent Number: 5,739,591
[45] Date of Patent: Apr. 14, 1998

[54] SEMICONDUCTOR DEVICE WITH A CARRIER BODY ON WHICH A SUBSTRATE WITH A SEMICONDUCTOR ELEMENT IS FASTENED BY MEANS OF A GLUE LAYER AND ON WHICH A PATTERN OF CONDUCTOR TRACKS IS FASTENED

[75] Inventors: Ronald Dekker; Henricus G. R. Maas, both of Eindhoven, Netherlands

[73] Assignee: U.S. Philips Corporation, New York, N.Y.

[21] Appl. No.: 889,716

[22] Filed: Jul. 8, 1997

Related U.S. Application Data

[63] Continuation of Ser. No. 548,933, Oct. 26, 1995, abandoned.

[30] Foreign Application Priority Data

Nov. 22, 1994 [EP] European Pat. Off. ............ 94203386

[51] Int. Cl.[6] ........................................ H01L 23/48
[52] U.S. Cl. ............... 257/780; 257/781; 257/75; 257/779
[58] Field of Search ..................... 257/734, 737, 257/738, 750, 751, 779, 780, 781, 784

[56] References Cited

U.S. PATENT DOCUMENTS 4,980,308  12/1990  Hayashi et al. ............... 437/41
5,213,990   5/1993  Rodder ......................... 437/40
5,254,868  10/1993  Saito ............................ 257/774
5,286,670   2/1994  Kang et al. .................... 437/61
5,349,228   9/1994  Neudeck et al. .............. 257/365

*Primary Examiner*—Carl W. Whitehead
*Attorney, Agent, or Firm*—Steven R. Biren

[57] ABSTRACT

A semiconductor device with a carrier body on which a substrate is fastened by means of a glue layer, which substrate is provided at its first side facing the carrier body with a semiconductor element and with a pattern of conductor tracks comprising contact electrodes for external contacting from the second side of the substrate facing away from the carrier body. The substrate is provided with windows at the areas of the contact electrodes for external contacting from the second side. The process steps preceding the gluing of the substrate to the carrier body are carried out in a clean room suitable for the manufacture of semiconductor elements, whereas the remaining process steps are preferably carried out in a final mounting room. Expensive lithographical equipment need not be available in both rooms, because the comparatively large windows can be formed by means of a simple contact mask.

20 Claims, 2 Drawing Sheets

SEMICONDUCTOR DEVICE WITH A CARRIER BODY ON WHICH A SUBSTRATE WITH A SEMICONDUCTOR ELEMENT IS FASTENED BY MEANS OF A GLUE LAYER AND ON WHICH A PATTERN OF CONDUCTOR TRACKS IS FASTENED

This is a continuation of application Ser. No. 08/548,933, filed Oct. 26, 1995 now abandoned.

BACKGROUND OF THE INVENTION

The invention relates to a semiconductor device with a carrier body on which a substrate is fastened by means of a glue layer, which is provided at its first side facing the carrier body with a semiconductor element, and which is further provided with a pattern of conductor tracks comprising contact electrodes (or bond pads) for external contacting from the second side of the substrate facing away from the carrier body.

The semiconductor device may comprise a single semiconductor element or a large number of such elements, in the former case it is a discrete semiconductor device, in the latter case an integrated semiconductor device. The semiconductor element may be, for example, a bipolar transistor or a field effect transistor. In addition to these active elements, the semiconductor device may also comprise passive elements such as, for example, coils, capacitors, and optical waveguides.

The substrate is heated a few times to a temperature far in excess of 200° C. in practice during manufacture of the semiconductor example, during the formation of semiconductor zones, up to approximately 900° C., during epitaxial growing of layers of semiconductor material, up to approximately 1000° C., and during deposition of layers of insulating material, approximately 400° to 700° C. After the semiconductor device has been formed, the substrate is not heated to temperatures above 200° C. any more in further process steps. Accordingly, the substrate with the semiconductor element can be fastened to a carrier body of glass by means of, for example, a synthetic resin glue such as an epoxy or acrylate glue. The glass is allowed to have a coefficient of expansion which is different from that of the semiconductor material.

U.S. Pat. No. 4,980,308 discloses a semiconductor device of the kind mentioned in the opening paragraph in which the pattern of conductor tracks is partly provided on the first side facing the carrier body and partly on the second side of the substrate facing away from the carrier body. These portions of the pattern of conductor tracks provided on both sides of the substrate are interconnected by connection zones formed in the substrate. External contacting of the semiconductor device may take place at the second side of the substrate.

The portion of the pattern on the first side of the substrate is formed before the substrate is fastened to the carrier body with glue, whereas the portion of the pattern on the second side is formed after this moment. In practice, process steps preceding gluing are carried out in a special clean room suitable for the manufacture of semiconductor elements, whereas gluing itself and the subsequent process steps are preferably carried out in a less clean room suitable for final mounting. Said two portions of the pattern of conductor tracks in that case will be provided in different rooms. Since the manufacture of these two comparatively complicated portions of the pattern requires a metallization process with which conductor tracks of comparatively small dimensions can be realised, a set of very expensive deposition and photolithographical equipment must be present in both these rooms.

SUMMARY OF THE INVENTION

The invention has for its object inter alia to improve the semiconductor device mentioned in the opening paragraph such that it can be manufactured in two different rooms, expensive deposition and photolithographical equipment having to be present in the clean room, but not in the other room which is suitable for final mounting.

According to the invention, the semiconductor device is for this purpose characterized in that the pattern of conductor tracks with contact electrodes for external contacting is provided on the first side of the substrate which at the areas of the bond pads is provided with windows for external contacting from the second side.

The pattern of conductor tracks which is provided on the same side of the substrate as the semiconductor element may accordingly be provided in a very clean space (clean room) with the deposition and photolithographical equipment present there. The pattern of conductor tracks is provided with bond pads for external contacting then. These bond pads, or contact electrodes, are comparatively large, having a length and width of, for example, 100 µm in practice. After the substrate has been fastened on the carrier body, the windows for external contacting may be provided in the substrate from the second side in a space suitable for final mounting. These windows are slightly smaller than the contact electrodes, having a length and width of, for example, 90 µm. So these windows are also comparatively large and may be provided by simple means in an inexpensive manner, without the use of advanced deposition or lithographical equipment. The windows may be defined in a photoresist layer by means of a simple contact mask in usual manner, after which the windows can be etched into the substrate in an etching bath. The semiconductor device can be externally contacted through the windows thus formed.

The substrate may be a usual slice of semiconductor material. The semiconductor element and the pattern of conductor tracks with the contact electrodes are then formed at the first side of the slice. The windows for external contacting are etched from the second side. The thickness of the slice is a disadvantage in this. This thickness is great compared with the length and width of contact electrodes and contact windows. Preferably, the substrate has a thickness which is small compared with these dimensions, for example, smaller than 10 µm.

The substrate may be made very thin when it consists of a layer of insulating material, the semiconductor element being provided in a layer of silicon present on the substrate. A substrate with a thickness of less than 1 µm can be realised thereby, in which windows of the dimensions mentioned above can be provided in a simple manner.

The insulating layer forming the substrate may then be covered with the silicon layer over its entire surface. The pattern of conductor tracks with the contact electrodes is then provided on the silicon layer. The windows for external contacting in that case may be etched into the insulating layer only or into the insulating layer and the silicon layer. In the former case, a thin silicon layer is present between the external contact elements to be provided and the contact electrodes, in the latter case it is not. In the former case, a low contact resistance can be realised through strong doping of the silicon layer at the areas of the contact electrodes. In the latter case, this contact resistance is a minimum. In either case, however, the contact elements to be provided are connected to silicon, which should be taken into account in the design of the semiconductor element.

Preferably, the silicon layer is convened into silicon oxide adjacent an island in which the semiconductor element is present, and the contact electrodes are formed on the silicon oxide layer adjacent said island, or the silicon layer is locally present on the substrate in the form of an island and the contact electrodes are formed directly on the substrate adjacent said silicon island. In the former case, the contact windows are formed not only in the substrate but also in the silicon oxide layer. In either case, the contact electrodes are exposed during etching of the windows, so that the contact elements to be provided are in direct contact with the contact electrodes. The contact resistance is accordingly a minimum. Since the contact electrodes are fully separated from the semiconductor element, the latter can be designed fully independently.

The semiconductor device can be made in a simple manner when the substrate is formed from a silicon slice which is provided at its first side with a buried insulating layer, from which slice silicon is removed from the second side down to the buried insulating layer. The semiconductor element may then be formed in the silicon slice in the silicon layer present above the buried insulating layer at the first side in a usual manner in the clean room. After that, and possibly after the silicon layer has been locally removed from the first side, the pattern of conductor tracks can be provided. Then the slice is fastened with its first side on the carrier body by means of a glue layer, after which silicon is removed from the second side down to the buried insulating layer. Finally, the windows may be provided from the second side which faces away from the carrier body.

BRIEF DESCRIPTION OF THE DRAWINGS

The invention will be explained in more detail below by way of example, with reference to a drawing in which.

DETAILED DESCRIPTION OF THE PREFERRED EMBODIMENT

Figure 1:
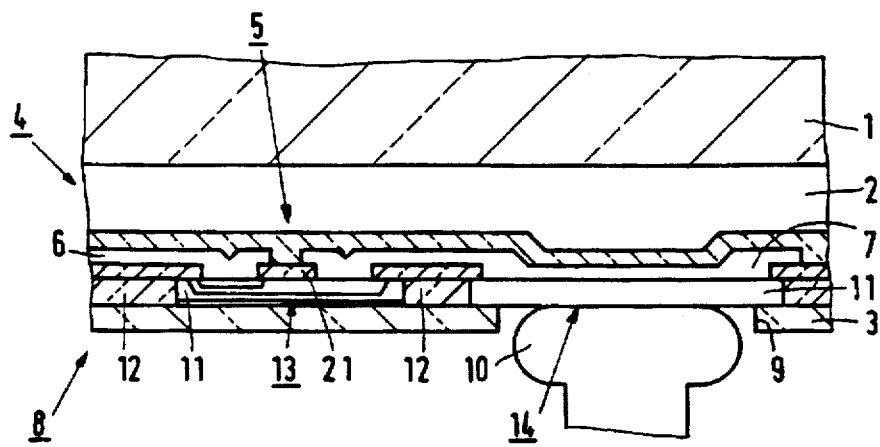
FIG. 1 diagrammatically and in cross-section shows a first embodiment of a semiconductor device according to the invention.

FIG. 1 diagrammatically and in cross-section shows a semiconductor device with a carrier body 1 on which a substrate 3 is fastened by means of a glue layer 2, which substrate is provided with a semiconductor at its first side 4 facing the carrier body element 5, and which is further provided with a pattern of conductor tracks 6 with contact electrodes or bond pads 7 for external contacting from the second side 8 of the substrate facing away from the carrier body.

A single semiconductor element 5, here a bipolar transistor, has been drawn in this example. In practice, however, such a semiconductor device may alternatively comprise a large number of such elements. The former case relates to a discrete, the latter case to an integrated semiconductor device. The semiconductor element may be, for example, a field effect transistor instead of the bipolar transistor 5 drawn. Besides these active elements, the semiconductor device may in addition comprise passive elements such as, for example, coils, capacitors, and optical waveguides.

According to the invention, the pattern of conductor tracks 6 with contact electrodes 7 for external contacting is provided at the first side 4 of the substrate 3, which is provided with windows 9 for external contacting from the second side 8 at the areas of the contact electrodes 7.

Process steps yet to be described which precede the fastening of the substrate 3 to the carrier body 1 by means of the glue layer 2 are carried out in a special clean room suitable for the manufacture of semiconductor elements, whereas gluing itself and the subsequent process steps are preferably carried out outside the clean room in a less clean space equipped for final mounting. Complicated processes are required for making the semiconductor elements and the pattern of conductors, for which very expensive deposition and photolithographical equipment is used. Such expensive equipment is not necessary in the space for final mounting in the manufacture of the semiconductor device according to the invention.

The pattern of conductor tracks 6 provided on the same side of the substrate 3 as the semiconductor element 5 may be provided in the clean room by means of the deposition and photolithographical equipment present there. The pattern of conductor tracks 6 is provided with contact electrodes 7 for external contacting during this. These contact electrodes 7, also called bond pads, are comparatively large, having a length and a width of, for example, 100 µm in practice. Subsequently, after the substrate 3 has been fastened on the carrier body 1, the windows 9 for external contacting from the second side 8 may be provided in the substrate 1 in a space suitable for final mounting. These windows are slightly smaller than the contact electrodes 7 and have a length and width of, for example, 90 µm. So these windows 9 are also comparatively large and may be provided inexpensively by simple means without the use of advanced deposition or lithographical equipment. The windows 8 may be defined in a photoresist layer by means of a simple contact mask in a usual manner, after which they can be etched into the substrate in an etching bath. The semiconductor device with the contact elements 10 may be externally contacted through the windows 9 thus formed.

The substrate 3 in the embodiment shown in FIG. 1 is a layer of insulating material, the semiconductor element 5 being provided in a layer of silicon 11 present on the substrate 3. As will become apparent below, such a substrate 3 can be realised with a thickness much smaller than the length and width of the windows 9. This thickness may be less than 1 µm. Windows 9 of the above dimensions can be provided therein in a simple manner. This would not be the case if the substrate were a usual slice of semiconductor material. The thickness of this slice would then be a disadvantage in etching of the windows. This thickness is great compared with the length and width of contact electrodes and contact windows.

In the embodiment shown in FIG. 1, the insulating layer forming the substrate 3 is covered with the silicon layer 11 over its entire surface. The pattern of conductor tracks 6 with the contact electrodes 7 is provided on the silicon layer 11. The windows 9 for external contacting are etched in the substrate layer 3 only. The silicon layer 11 is present between the external contact elements 10 to be provided and the contact electrodes 7. To realise a low contact resistance between the contact elements 10 and the contact electrodes 7, the silicon layer 11 is strongly doped at the areas of the contact electrodes 7. The silicon layer 11 is subdivided into insulated island 13 and 14 by means of insulating portions 12 of silicon oxide in order to prevent the contact elements 11 from being connected to the portion of the silicon layer 11 in which the semiconductor element 5 is formed. The island 13 comprises the semiconductor element 5, the island 14 connects the contact element 10 to the contact electrode 7. The insulating portions 12 may be formed in usual manner through local oxidation of the silicon layer 11.

It is possible for the window 8 to be formed not only in the substrate 3 but also in the silicon layer 11. The contact element 10 is then directly connected to the contact electrode 7. Also in this case, which is not drawn, the portion of the silicon layer 14 in which a window is etched must be insulated from the portion 13 in which the semiconductor element is formed. Here, too, the isolating portions 12 may formed in usual manner through local oxidation of the silicon layer 11.

Figure 2:
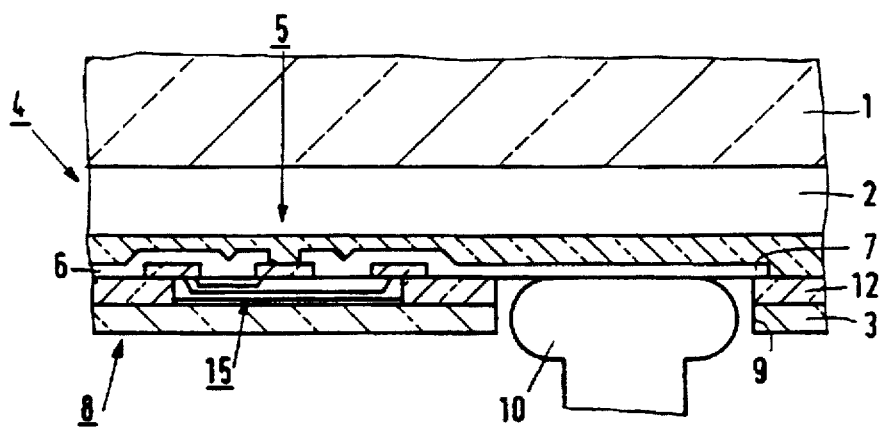
FIG. 2 diagrammatically and in cross-section shows a second embodiment of a semiconductor device according to the invention.

In the embodiment shown in FIG. 2, where corresponding components have the same reference numerals as in the embodiment of FIG. 1, the silicon layer is converted into insulating silicon oxide 12 through local oxidation over its entire surface next to the island 15 in which the semiconductor element 5 is formed. The contact electrodes 7 are provided on this insulating layer 12 next to the island 15. The windows 9 are etched not only into the substrate 3 but also into the insulating layer 12. The contact electrodes 7 are exposed during etching of the windows 9, so that the contact elements 10 to be provided are in direct contact with the contact electrodes 7. The contact resistance is accordingly a minimum. The contact electrodes 7 are also fully separated from the semiconductor element 5 now.

Figure 3:
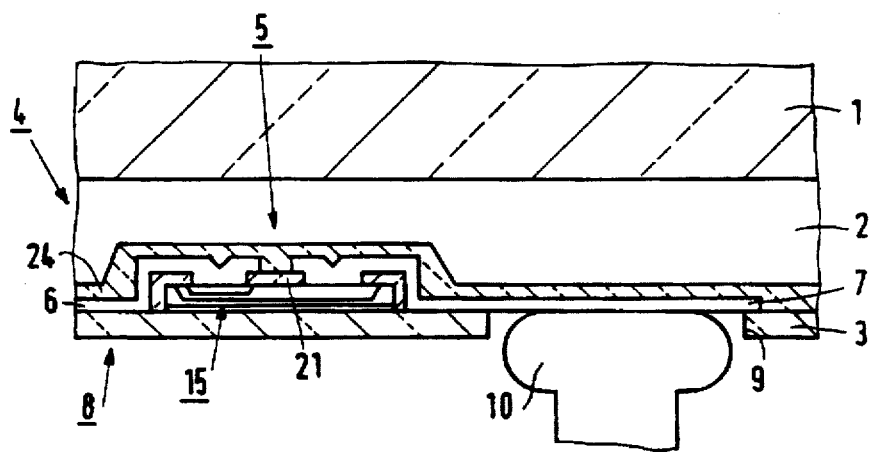
FIG. 3 diagrammatically and in cross-section shows a third embodiment of a semiconductor device according to the invention, and FIGS. 4 to 7 diagrammatically, in cross-section and in plan view, show a few stages in the manufacture of the semiconductor device as shown in FIG. 3.
Figure 4:
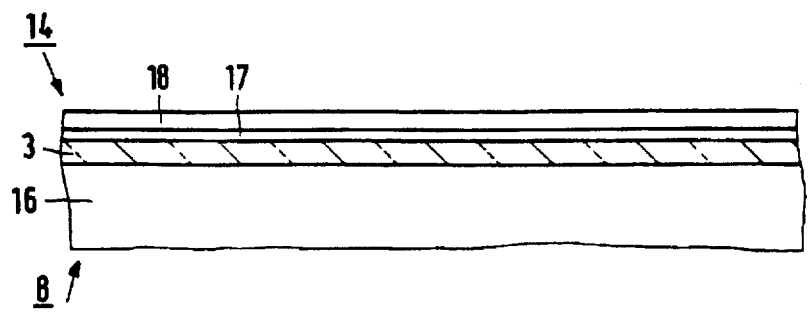

In the embodiment shown in FIG. 3, where corresponding components have the same reference numerals as in the embodiment of FIG. 1, the silicon layer is locally present on the substrate 3 in the form of an island 15, and the contact electrodes 7 are formed directly on the substrate 3 next to this island 15. Contact electrodes 7 are exposed during etching of the windows 9, so that the contact elements 10 to be provided are in direct contact with the contact electrodes 7. The contact resistance accordingly is a minimum. The contact electrodes 7 are now fully separated from the semiconductor element 5.

FIGS. 4 to 7 diagrammatically show a few stages in the manufacture of the semiconductor device of FIG. 3, in cross-section and in plan view. The starting point is a silicon slice 16 shown in cross-section in FIG. 4. This slice is provided at the first side 4 with the insulating layer 3 of silicon oxide having a thickness of approximately 0.4 μm, with a silicon layer 17 comparatively strongly doped with approximately $10^{20}$ phosphorus atoms per cc and having a thickness of approximately 0.1 μm, and with a silicon layer 18 comparatively weakly doped with approximately $10^{16}$ phosphorus atoms per cc and having a thickness of approximately 0.1 μm. Such a slice may be manufactured, for example, by usual wafer bonding techniques. By such a technique, a first slice of silicon provided with a silicon oxide top layer is connected by this top layer to a second silicon slice, after which silicon is removed from the first slice until only the thin layer of silicon referred to remains on the oxide layer. Preferably, the buried insulating layer 3 is formed in the silicon slice 16 through implantation of ions which form a insulating material with silicon, such as nitrogen or oxygen ions. The slice 16 with the silicon oxide layer 3 and the doped silicon layers 17 and 18 is obtained in a silicon slice, for example, in that the silicon oxide layer 3 is formed at a depth of approximately 0.1 μm through implantation of oxygen ions, in that the approximately 0.1 μm thick layer 17 situated above the silicon oxide layer 3 is doped with phosphorus to achieve said concentration, and in that finally the doped layer 18 is epitaxially grown on the layer 17.

Figure 5:
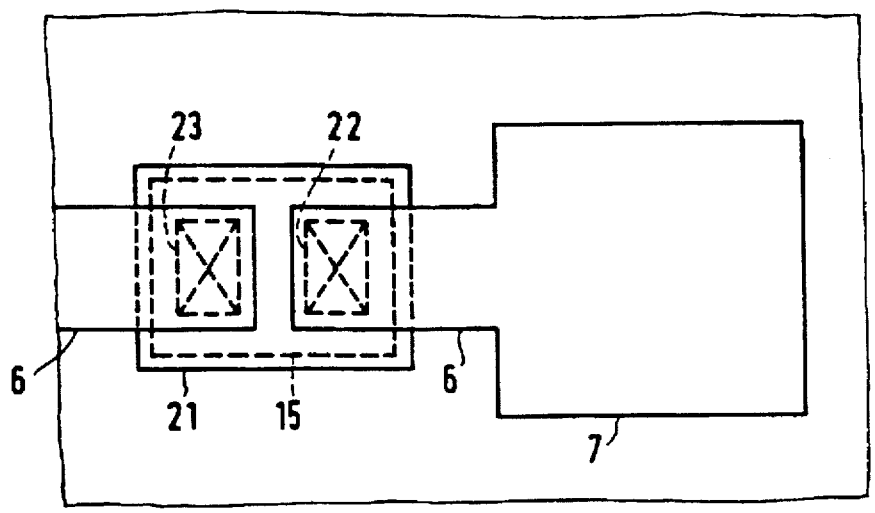
Figure 6:
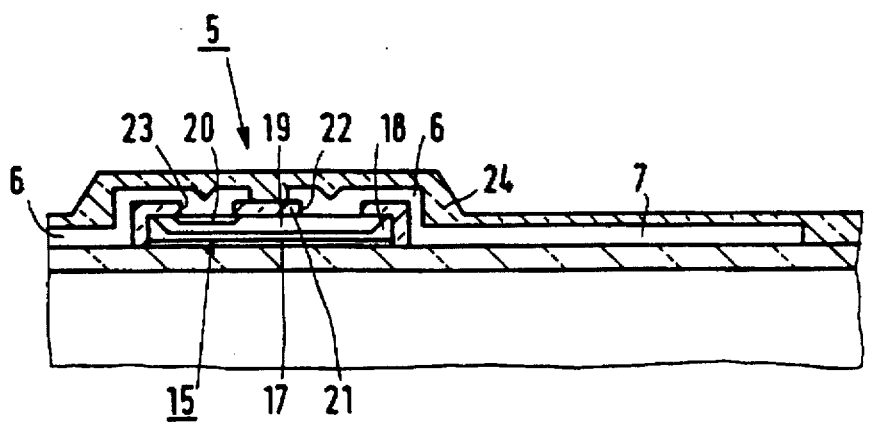
Figure 7:
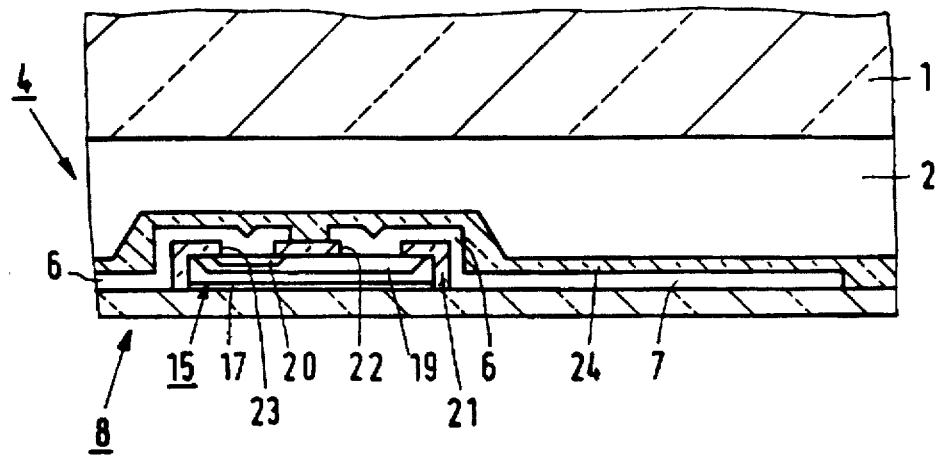

As FIGS. 5 and 6 show in plan view and in cross-section, respectively, an insulating island 15 is formed in the silicon layer. A portion of the layer 17 and 18 is for this purpose removed from the insulating layer 3 in the example. The bipolar transistor 5 is subsequently formed in usual manner in the silicon island 15, with a base zone 19 with a doping of approximately $5.10^{17}$ boron atoms and an emitter zone 20 with a doping of approximately $10^{20}$ arsenic atoms. Then the silicon island 15 is provided with a silicon oxide layer 21 in which windows 22 and 23 are provided for contacting the base zone 19 and the emitter zone 20, respectively.

After the transistor 5 has been formed, the pattern of conductor tracks 6 with contact electrodes 7 is formed in an aluminium layer deposited on the substrate 3. The semiconductor device is not depicted true to scale in the Figures for reasons of clarity, for example, the conductor tracks 6 in practice have a width of approximately 1 to 10 μm, the contact electrodes have a length and width, for example, of approximately 100 μm.

Subsequently, the entire assembly is coated with a further insulating layer 24 and is fastened with its first side 4 to the carrier body 1 by means of the glue layer 2. The glue is, for example, an epoxy or an acrylate glue, the carrier body 1 is, for example, a glass plate. Then the silicon slice 16 is removed down to the insulating layer 3. To achieve this, the second side 8 of the slice 16 is subjected to a chemical-mechanical polishing treatment until the insulating layer 3 has been approached up to a few μm, after which the layer 3 is exposed to an etching bath of KOH. This etching treatment stops automatically the moment the insulating silicon oxide layer 3 is reached.

During the manufacture of the transistor 5, the slice 16 is heated to temperatures far in excess of 200° C. a few times. This takes place during epitaxial growing of the layer 18, up to approximately 1000° C., during the formation of the semiconductor zones 19 and 20, up to approximately 900° C., and during deposition of layers of insulating material 21 and 24, approximately 400° to 700° C. After the transistor has been formed, the slice 16 is not heated to temperatures above 200° C. any more during subsequent process steps. The slice 16 can accordingly be fastened to a glass carrier body 1 by means of a synthetic resin glue layer 2 such as an epoxy or acrylate glue layer. The glass is allowed to have a coefficient of expansion here which is different from that of the semiconductor material.

Finally, the windows 9 having a length and width of approximately 90 μm are provided in the substrate 3 in usual manner by means of a contact mask and an etching bath containing HF. The contact elements 10 may finally be provided from the second side 8. The contact elements in the example are formed by a usual wire bonding technique. Alternatively, however, they may be formed from electrochemically grown metal parts (bumps).

What is claim is:

1. A semiconductor device, comprising:
    a semiconductor element;
    a carrier body;
    a substrate fastened to the carrier body, the substrate having a distal side and a proximal side, said distal side being disposed adjacent the carrier body and said proximal side being disposed opposite the carrier body;
    a contact electrode disposed only at said distal side of the substrate, said contact electrode being coupled to the semiconductor element; and
    a window disposed through the substrate at the contact electrode so that said contact electrode is exposed from said proximal side of the substrate, whereby said contact electrode provides for electrical connection to the semiconductor element accessible at said distal side from said proximal side, through the substrate.

2. The semiconductor device of claim 1, wherein the substrate consists of a layer of insulating material, and the semiconductor element is formed in a layer of silicon present on the distal side of the substrate.

3. The semiconductor device of claim 2, wherein the silicon layer is converted into silicon oxide adjacent an island in which the semiconductor element is present, and the contact electrodes are formed on the silicon oxide layer adjacent said island.

4. The semiconductor device of claim 2, wherein the silicon layer is locally present on the substrate in the form of an island and the contact electrodes are formed directly on the substrate adjacent said silicon island.

5. The semiconductor device of claim 4, wherein the semiconductor substrate is formed from a silicon slice which is provided at its first side with a buried insulating layer, from which slice silicon is removed from the second side down to the buried insulating layer.

6. The semiconductor device of claim 5, wherein the buried insulating layer is formed in the silicon slice through implantation of ions which form an insulating material with silicon.

7. The semiconductor device of claim 6, wherein the buried insulating layer is formed in the silicon slice through implantation of nitrogen ions.

8. The semiconductor device of claim 6, wherein the buried insulating layer is formed in the silicon slice through implantation of oxygen ions.

9. The semiconductor device of claim 3, wherein the semiconductor substrate is formed from a silicon slice which is provided at its first side with a buried insulating layer, from which slice silicon is removed from the second side down to the buried insulating layer.

10. The semiconductor device of claim 2, wherein the semiconductor substrate is formed from a silicon slice which is provided at its first side with a buried insulating layer, from which slice silicon is removed from the second side down to the buried insulating layer.

11. The semiconductor device of claim 1, wherein the carrier body and the substrate are fastened by a glue layer.

12. The semiconductor device of claim 1, further comprising a conductor electrode providing for coupling of the contact electrode and the semiconductor element, said conductor electrode being disposed only at said distal side of the substrate.

13. The semiconductor device of claim 1, wherein the semiconductor element is disposed at said distal side of the substrate.

14. The semiconductor device of claim 13, further comprising a conductor electrode providing for coupling of the contact electrode and the semiconductor element, said conductor electrode being disposed only at said distal side of the substrate.

15. The semiconductor device of claim 13, wherein the contact electrode has a large area relative to said semiconductor element, said area being determined by sufficiency to provide for formation of the associated window using a contact mask process.

16. The semiconductor device of claim 15, wherein the contact electrode has at least one dimension of about 100 μm or greater.

17. The semiconductor device of claims 1, wherein the contact electrode has a large area relative to said semiconductor element, said area being determined by sufficiency to provide for formation of the associated window using a contact mask process.

18. The semiconductor device of claim 17, wherein the contact electrode has at least one dimension of about 100 μm or greater.

19. A semiconductor device, comprising:
a semiconductor element having predetermined minimum and maximum geometries;
a carrier body;
a substrate fastened to the carrier body, the substrate having a distal side and a proximal side, said distal side being disposed adjacent the carrier body and said proximal side being disposed opposite the carrier body;
a contact electrode having a selected area, said contact electrode being coupled to said semiconductor element and being disposed at said distal side of the substrate; and
a window disposed through the substrate at the contact electrode so that said contact electrode is exposed from said proximal side of the substrate, said window having a window selected area determined by the selected area of the contact electrode, said area of the contact electrode being large relative to the minimum geometries of said semiconductor element and being determined by sufficiency to provide for formation of the window using a contact mask process.

20. The semiconductor device of claim 19, wherein the contact electrode has at least one dimension of about 100 μm or greater.

\* \* \* \* \*